Nov. 10, 1970 G. SCHAFFNER 3,539,884

INTEGRATED TRANSISTOR AND VARIABLE CAPACITOR

Filed Sept. 18, 1968

INVENTOR.
GERALD SCHAFFNER
BY
Mueller, Aichele & Rauner
ATTORNEYS

United States Patent Office 3,539,884
Patented Nov. 10, 1970

3,539,884

INTEGRATED TRANSISTOR AND VARIABLE CAPACITOR

Gerald Schaffner, Phoenix, Ariz., assignor to Motorola, Inc., Franklin Park, Ill., a corporation of Illinois

Filed Sept. 18, 1968, Ser. No. 760,634
Int. Cl. H01l *1/06*
U.S. Cl. 317—235 2 Claims

ABSTRACT OF THE DISCLOSURE

A monolithic chip has an NPN transistor and a variable capacitance diode junction extending therein from the same surface. A common electrode which connects the cathode and the collector respectively of the variable capacitance diode and the transistor is a conductive case terminal of a package. The base and emitter electrodes of the transistor and the anode of the diode are connected to different insulated posts. A ceramic chip bypass capacitor is mounted on the conductive case electrode but not connected electrically to it and connected respectively to the base and the anode insulated posts. A common collector supply and reversed bias supply for the variable capacitance diode is provided to the common case electrode. The circuit is usable for AFC and any other tunable circuit wherein the control bias is used to control the tuning.

BACKGROUND OF THE INVENTION

This invention relates to semiconductor integrated circuits and particularly to an integrated circuit having a variable capacitance diode and transistor.

In television circuits and other tunable circuits a varactor or tuning diode is quite often used to vary or control the frequency of operation of a circuit. A variable voltage bias across the diode alters its capacitance to thereby adjust tuning. At these higher frequencies in the VHF and UHF range, these tuning diodes have an inductance associated with the leads and the case in which the semiconductor die is mounted. This provides a tuned circuit in the variable capacitance diode package which has an effect of degenerating circuit performance, that is, this parasitic inductance must be designed around. Since the inductance varies from one specimen to another complete design around is quite difficult.

SUMMARY OF THE INVENTION

It is an object of the invention to provide an integrated circuit utilizing a tuning diode which eliminates the inductance problems associated with a tuning diode package, lowers costs and increases reliability.

The feature of the present invention is the provision of an NPN transistor and a variable capacitance diode formed from one surface of a monolithic chip.

Another feature is the provision of a monolithic chip as set forth in the previous feature and mounted on a conductive case electrode having insulated connecting posts with bypass ceramic chip capacitors forming bypass capacitors for a circuit in which the assembly is to be used.

As assembly using the teaching of the present invention comprises a monolithic chip mounted on a common case electrode wherein the substrate of the chip is in electrical connection with the case electrode and forms the common electrode for an NPN transistor and the cathode for a variable capacitance diode. Both the transistor and diode extend into the chip from a common surface. Electrodes on the common surface respectively connect the emitter base and anodes to three different insulated connecting posts. A ceramic chip capacitor is connected between the base and anode insulated posts. The circuit is operable at the higher frequency ranges.

The common electrode may be mounted on an insulated base and electrically connected to outside the case through an insulated post.

THE DRAWING

DETAILED DESCRIPTION OF THE ILLUSTRATIVE EMBODIMENT

Figure 2:
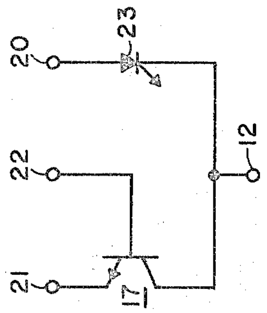
FIG. 2 is a schematic diagram showing the circuit equivalent of the FIG. 1 illustrated structure.

Referring more particularly now to the drawing, like numbers indicate like parts and structural features in the various views and diagrams.

A monolithic chip 10 and N+ region in 11 with the common electrode 12 formed thereon. Immediately above region 11, there is a higher resistivity N region 9. From the upper surface 13, which is passivated by a silicon dioxide layer 14, a transistor including emitter region 15, base region 16 is formed into chip 10. This transistor 17 utilizes the substrate region 9 as its collector electrode and connections thereto are made through the higher doped region 11 and the common electrode 12. Extending into region 9, from the upper surface 13, is also a highly doped P+ region 18 forming a variable capacitor junction 19 with region 9. The region 9 serves as the cathode for the variable capacitance junction and is connected to other circuitry through N+ region 11 and common electrode 12. The anode region 18 is in ohmic relation to anode electrode 20. The other electrodes completing the monolithic chip include the emiter electrode 21 and the base electrode 22 respectively in ohmic connection with regions 15 and 16.

The formation of regions 15, 16 and 18 into region 9 can be by well known diffusion processes. For example, the region 16 being a P region is first formed into region 9. During the same diffusion, region 18 is partially formed through a window in the oxide layer 14. Then the P region 16 may be closed off and the P diffusion continued to increase the doping level of region 18 to that desired for a variable capacitance diode.

The variable capacitance of junction 19 is affected by the depth and breadth of the depletion zone indicated by dotted line 21 in region 12. The greater the junction area or the greater the doping level of region 18, the greater the capacitance exhibited by junction 19. As the diode junction 19 is reverse biased, the depletion zone 21 extends further and further into region 12. As the depletion zone increases in depth, the capacitance exhibited by the reverse bias junction decreases with a corresponding increase in voltage. This phenomena is well known and understood and will not be further described for that reason.

The equivalent circuit is shown in FIG. 2 wherein the emitter electrode 21 is shown as a terminal for transistor 17; the base electrode 22 is likewise shown. The common electrode 12 is shown as being connected to the collector of transistor 17 and the cathode of variable capacitance diode 23; the anode is connected to electrode 20.

Figure 3:
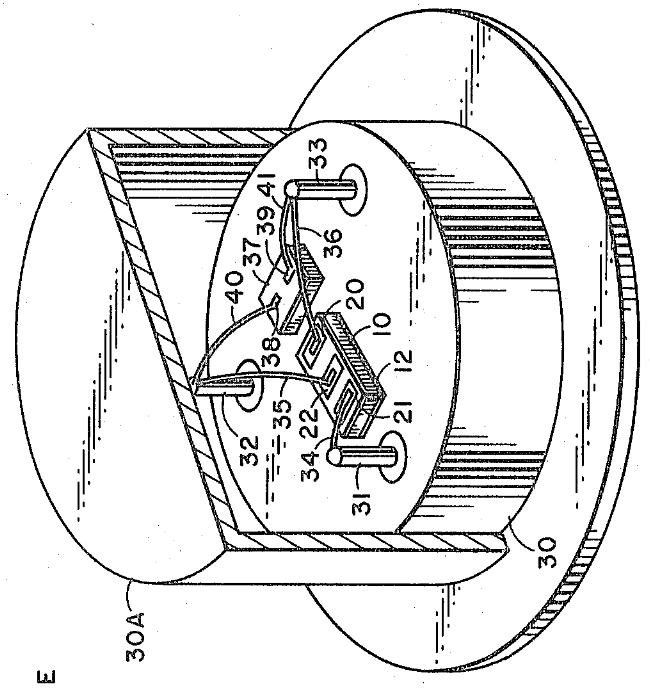
FIG. 3 is a diagrammatic isometric view of an assemblage in accordance with the teachings of the present invention and showing a monolithic chip of FIG. 1 and a ceramic chip capacitor on a common case electrode.
Figure 1:
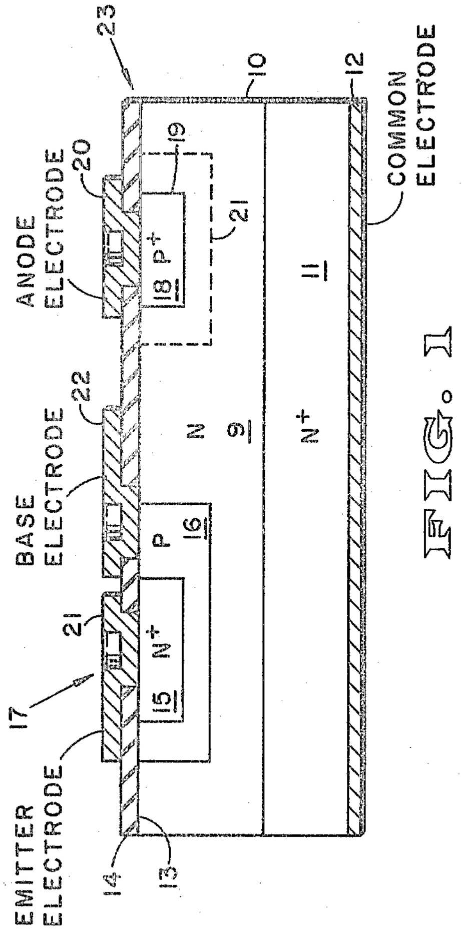
FIG. 1 is a diagrammatic cross-sectional view of a monolithic chip made in accordance with the present invention.

Referring next to FIG. 3, the monolithic chip 10 is shown mounted in thermal and electrical conductive relationship to the common case electrode 30. Common case electrode 30 has three insulated connecting posts 31, 32 and 33 and is covered by cap 30A which may be utilized as an electrical terminal for the assembly. The emitter electrode 21 is connected by a wire 34 to emitter insulated post 31. In a similar manner the base electrode 22 is connected by a wire 35 to the base insulated post 32. Likewise, the anode electrode 20 is connected by wire 36 to bias insulated post 33. Additionally, since the assemblage is to be used at high frequencies, a ceramic chip capacitor 37 is mounted either directly on common case electrode 30 or on an insulator. In either case there should be low capacitive coupling from chip capacitor 37 to case electrode 30. Case 30 is suitably sealed by a cap 30A to protect the electrical components 10 and 37. The cap may be conductive to facilitate mounting the case electrode 30 in a stripline or wave guide to eliminate case inductance problems. Ceramic chip capacitor 37 may have two upper connections 38 and 39 respectively connected by wires 40 and 41 to the insulated posts 32 and 33. Since insulated post 32 is normally connected to ground reference potential, the ceramic chip capacitor 37 forms a bypass capacitance for the anode of varactor diode 23. It is understood that printed electrical connections may be substituted for wires 35, 36, 40 and 41.

Figure 4:
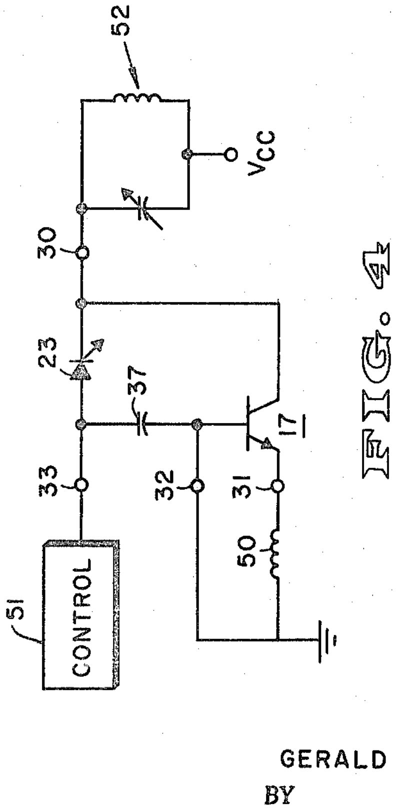
FIG. 4 is a schematic diagram of the assemblage of FIG. 3 as used in a circuit for controlling the frequency of a frequency determining portion (of another device not shown).

Referring next to FIG. 4 a schematic diagram of the assembly of FIG. 3 is shown as it could be connected into a a tunable circuit. The emitter of transistor 17 is connected through insulated post 31, through an RFC choke 50 to ground reference potential. The base electrode is connected through terminal 32 to the same ground reference potential and to the ceramic chip bypass capacitor 37. A control bias source 51, such as for an AFC DC signal, is connected through terminal 33 to the anode of variable capacitor diode 23. The common case electrode 30 is connected to a tuned circuit 52 which is turn receives the collector supply voltage $V_{cc}$ for the monolithic chip. As shown, there is a capacitor and inductor in parallel to permit the direct current voltage to be supplied to the cathode of diode 23 and the collector of transistor 17. It is understood that other circuit configurations may be utilized with this assemblage.

With the described arrangement, lead inductance between the cathode of diode 23 and collector of transistor 17 is eliminated and other inductances are reduced. Since all the components are in a sealed package reliability is increased with respect to circuits constructed from discrete components.

I claim:

1. A semiconductor type unit including the combination:

a conductive case electrode having a plurality of insulated connecting posts extending therethrough for making external electrical connections to electrical components inside the case, an integrated circuit die having an N-type substrate and a common electrode and an upper surface, a first P region extending into said substrate from said upper surface, an N+ region extending into said first P region from said upper surface such as to form an NPN transistor between said N+ region, said first P region and said N-type substrate, a P+ region extending into said substrate from said upper surface in an area remote from said NPN transistor and forming a variable capacitance diode with said N-type substrate, electrode means on each of said regions for making electrical connections thereto, said conductive case electrode supporting said integrated circuit die at said common electrode, and electrical connection means extending between said electrode means and said respective insulated posts for electrically connecting said regions to said posts, respectively.

2. The unit of claim 1 further including a ceramic chip capacitor disposed on but electrically removed from said conductive case electrode and further electrical connection means extending to two of said insulated posts for forming a capacitive bypass connection, said two posts being electrically connected through said first mentioned electrical connection means and said electrode means to said P region and said P+ region, respectively.

References Cited

UNITED STATES PATENTS

| | | | |
|---|---|---|---|
| 3,878,804 | 4/1965 | Ullery et al. | 317—235 X |
| 3,341,755 | 9/1967 | Husher et al. | 317—235 |
| 3,453,505 | 7/1969 | Offner et al. | 317—235 |

JAMES D. KALLAM, Primary Examiner

U.S. Cl. X.R.

317—234